United States Patent
Mori (10) Patent No.: US 12,370,607 B2
(45) Date of Patent: *Jul. 29, 2025

(54) COATED TOOL AND CUTTING TOOL

(71) Applicant: KYOCERA CORPORATION, Kyoto (JP)

(72) Inventor: Satoshi Mori, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 448 days.

This patent is subject to a terminal disclaimer.

(21) Appl. No.: 17/906,860

(22) PCT Filed: Mar. 25, 2021

(86) PCT No.: PCT/JP2021/012688
§ 371 (c)(1),
(2) Date: Sep. 20, 2022

(87) PCT Pub. No.: WO2021/193860
PCT Pub. Date: Sep. 30, 2021

(65) Prior Publication Data
US 2023/0173587 A1    Jun. 8, 2023

(30) Foreign Application Priority Data
Mar. 27, 2020  (JP) ................ 2020-059024

(51) Int. Cl.
*B23B 27/14* (2006.01)
*C23C 14/02* (2006.01)
*C23C 28/04* (2006.01)

(52) U.S. Cl.
CPC .......... *B23B 27/148* (2013.01); *C23C 14/025* (2013.01); *C23C 28/044* (2013.01); *B23B 2228/105* (2013.01)

(58) Field of Classification Search
None
See application file for complete search history.

(56) References Cited

U.S. PATENT DOCUMENTS

| | | | | |
|---|---|---|---|---|
| 5,296,016 A | * | 3/1994 | Yoshimura | ............ C23C 30/005 75/238 |
| 5,783,295 A | * | 7/1998 | Barnett | ................... C23C 28/04 428/472 |

(Continued)

FOREIGN PATENT DOCUMENTS

| JP | S56-072105 A | 6/1981 |
|---|---|---|
| JP | 2006152321 A | 6/2006 |

(Continued)

OTHER PUBLICATIONS

Machine Translation of JP2006152321 (Year: 2006).
Machine Translation of JPS5672105 (Year: 1981).

*Primary Examiner* — Seth Dumbris
(74) *Attorney, Agent, or Firm* — HAUPTMAN HAM, LLP (57) ABSTRACT

A coated tool according to the present disclosure comprises a base body and a coating film. The base body is made of a cemented carbide or a cermet. The coating film is located on the base body. In a case where a hardness is measured by pressing an indenter from a surface of the coating film to a depth of 20% of the coating film while changing an indentation load of the indenter, when a minimum hardness of the hardness is defined as a first hardness, a maximum hardness of the hardness is defined as a second hardness, a depth at the first hardness is defined as a first hardness depth, and a depth at the second hardness is defined as a second hardness depth, the second hardness depth is smaller than the first hardness depth, and a difference therebetween is greater than 7 GPa.

8 Claims, 10 Drawing Sheets

(56) References Cited

U.S. PATENT DOCUMENTS

| | | | |
|---|---|---|---|
| 6,821,624 B2 * | 11/2004 | Utsumi | C23C 16/0272 |
| | | | 428/408 |
| 2007/0184272 A1 * | 8/2007 | Moriguchi | C23C 28/044 |
| | | | 428/411.1 |
| 2007/0254173 A1 | 11/2007 | Wallgram et al. | |
| 2010/0247885 A1 * | 9/2010 | Ito | C23C 14/027 |
| | | | 428/216 |
| 2016/0082518 A1 * | 3/2016 | Sakai | B23B 27/143 |
| | | | 407/115 |
| 2020/0055790 A1 * | 2/2020 | Setoyama | C23C 28/042 |
| 2023/0109727 A1 | 4/2023 | Mori | |

FOREIGN PATENT DOCUMENTS

| | | |
|---|---|---|
| JP | 5160231 B2 | 3/2013 |
| WO | 2019189775 A1 | 10/2019 |

\* cited by examiner

| SAMPLE | BASE BODY | COATING FILM ||||||||
|---|---|---|---|---|---|---|---|---|---|
| | | METAL LAYER || HARD LAYER |||||||
| | | | | FIRST METAL NITRIDE LAYER || SECOND METAL NITRIDE LAYER || FIRST METAL NITRIDE LAYER + SECOND METAL NITRIDE LAYER | THIRD METAL NITRIDE LAYER ||
| | | TYPE | THICKNESS (μm) | TYPE | THICKNESS (nm) | TYPE | THICKNESS (nm) | THICKNESS (μm) | TYPE | THICKNESS (μm) |
| WITHOUT METAL LAYER CEMENTED CARBIDE | CEMENTED CARBIDE | — | — | TiAlNbWSiN | 50 | AlCrN | 50 | 0.5 | TiAlNbWSiN | 2 |
| WITH METAL LAYER CEMENTED CARBIDE | | $Al_{70}Cr_{30}$ | 0.2 | | | | | | | |
| WITHOUT METAL LAYER CERMET | CERMET | — | — | | | | | | | |
| WITH METAL LAYER CERMET | | $Al_{70}Cr_{30}$ | 0.2 | | | | | | | |

FIG. 6

| SAMPLE | MAXIMUM HARDNESS (GPa) | MAXIMUM HARDNESS LOAD (mN) | MAXIMUM HARDNESS DEPTH (nm) | MINIMUM HARDNESS (GPa) | MINIMUM HARDNESS LOAD (mN) | MINIMUM HARDNESS DEPTH (nm) | MAXIMUM HARDNESS DIFFERENCE (GPa) | AVERAGE HARDNESS (GPa) | DIFFERENCE BETWEEN AVERAGE HARDNESS AND MAXIMUM HARDNESS (GPa) | DIFFERENCE BETWEEN AVERAGE HARDNESS AND MINIMUM HARDNESS (GPa) |
|---|---|---|---|---|---|---|---|---|---|---|
| WITHOUT METAL LAYER CEMENTED CARBIDE | 35.3 | 25 | 203.7 | 24.1 | 5 | 92.3 | 11.2 | 28.7 | 6.6 | 4.6 |
| WITH METAL LAYER CEMENTED CARBIDE | 35.1 | 20 | 183.6 | 24.5 | 80 | 562.2 | 10.6 | 28.8 | 6.3 | 4.3 |
| WITHOUT METAL LAYER CERMET | 29.1 | 55 | 349.4 | 21.5 | 80 | 559.6 | 7.6 | 24.9 | 4.2 | 3.4 |
| WITH METAL LAYER CERMET | 30.8 | 30 | 245 | 23.6 | 40 | 353.5 | 7.2 | 25.2 | 5.6 | 1.6 |

COATED TOOL AND CUTTING TOOL

RELATED APPLICATIONS

The present application is a National Phase of International Application Number PCT/JP2021/012688 filed Mar. 25, 2021 and claims priority of Japanese Application Number 2020-059024 filed Mar. 27, 2020.

TECHNICAL FIELD

The present disclosure relates to a coated tool and a cutting tool.

BACKGROUND ART

As a tool used for cutting processing such as turning processing or milling processing, a coated tool is known in which a surface of a base body such as cemented carbide, cermet, or ceramic is coated with a coating film to improve wear resistance, etc. (see Patent Document 1).

CITATION LIST

Patent Literature

Patent Document 1: JP 5160231

SUMMARY OF INVENTION

According to one aspect of the present disclosure, a coated tool includes a base body and a coating film. The base body is made of a cemented carbide or a cermet. The coating film is located on the base body. In addition, in a case where a hardness is measured by pressing an indenter from a surface of the coating film to a depth of 20% of the coating film while changing an indentation load of the indenter, when a minimum hardness of the hardness is defined as a first hardness, a maximum hardness of the hardness is defined as a second hardness, a depth at a first hardness is defined as a first hardness depth, and a depth at a second hardness is defined as a second hardness depth, the second hardness depth is smaller than the first hardness depth, and a difference between the first hardness and the second hardness is greater than 7 GPa.

DESCRIPTION OF EMBODIMENTS

The following is a detailed description of a coated tool and a cutting tool according to the present disclosure (hereinafter referred to as "embodiments") with reference to the drawings. It should be noted that the coated tool and the cutting tool according to the present disclosure are not limited by the embodiments. In addition, embodiments can be appropriately combined so as not to contradict each other in terms of processing content. In the following embodiments, the same portions are denoted by the same reference signs, and overlapping explanations are omitted.

In the embodiments described below, expressions such as "constant", "orthogonal", "vertical", and "parallel" may be used, but these expressions do not need to be exactly "constant", "orthogonal", "vertical", and "parallel". In other words, each of the above-described expressions allows for deviations in, for example, manufacturing accuracy, positioning accuracy, and the like.

In the related art described above, there is room for further improvement in terms of improving the adhesion between the coating film and the base body.

The present disclosure has been made in light of the foregoing, and provides a coated tool and a cutting tool capable of improving the adhesion between the coating film and the base body.

Coated Tool

Figure 1:
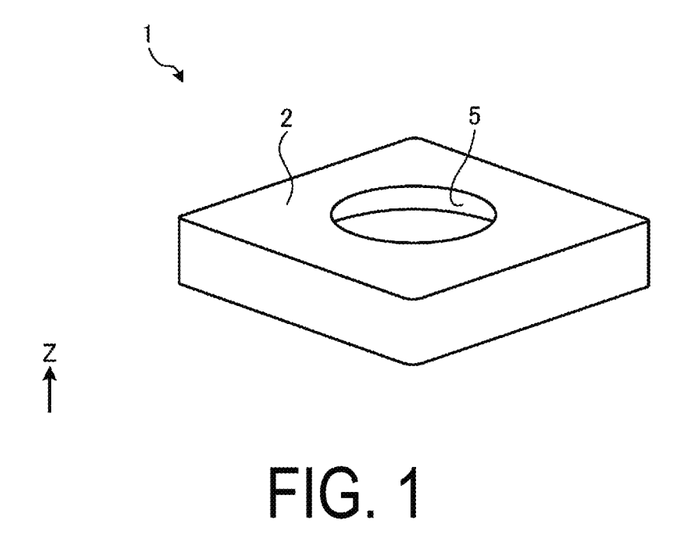
FIG. 1 is a perspective view illustrating an example of a coated tool according to an embodiment.
Figure 2:
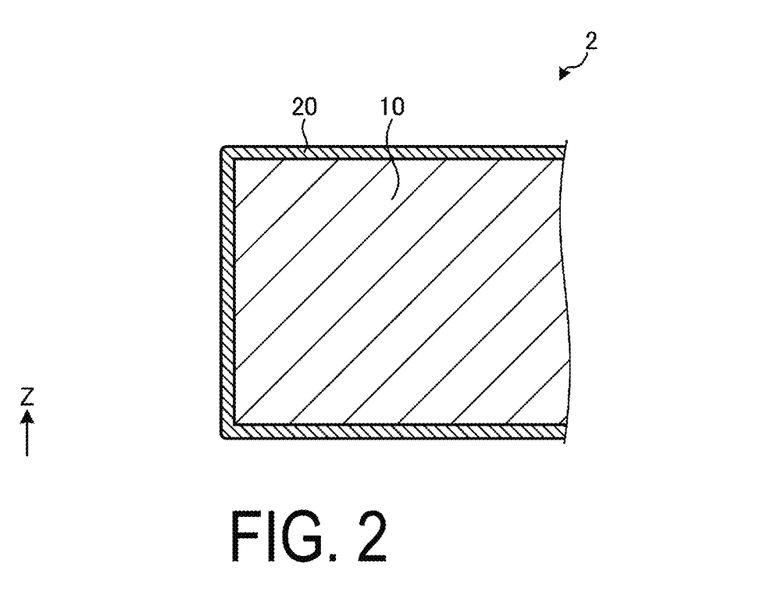
FIG. 2 is a side sectional view illustrating an example of the coated tool according to the embodiment.

FIG. 1 is a perspective view illustrating an example of a coated tool according to an embodiment. Further, FIG. 2 is a side sectional view illustrating an example of the coated tool according to the embodiment. As illustrated in FIG. 1, a coated tool 1 according to the embodiment includes a tip body 2.

Tip Body 2

The tip body 2 has a hexagonal shape in which a shape of an upper surface and a lower surface (a surface intersecting the Z-axis illustrated in FIG. 1) is a parallelogram.

One corner portion of the tip body 2 functions as a cutting edge portion. The cutting edge portion has a first surface (for example, an upper surface) and a second surface (for example, a side surface) connected to the first surface. In the embodiment, the first surface functions as a "rake face" for scooping chips generated by cutting, and the second surface functions as a "flank face". A cutting edge is located on at least a part of a ridge line where the first surface and the second surface intersect with each other, and the coated tool 1 cuts a work material through application of the cutting edge to the work material.

A through hole 5 that vertically penetrates the tip body 2 is located in the center portion of the tip body 2. A screw 75 for attaching the coated tool 1 to a holder 70 described later is inserted into the through hole 5 (see FIG. 5).

As illustrated in FIG. 2, the tip body 2 has a base body 10 and a coating film 20.

Base Body 10

The base body 10 is formed of, for example, a cemented carbide. The cemented carbide contains tungsten (W), specifically, tungsten carbide (WC). Further, the cemented carbide may contain nickel (Ni) or cobalt (Co). Alternatively, the base body 10 may be formed of a cermet. The cermet contains, for example, titanium (Ti), specifically, titanium carbide (TiC) or titanium nitride (TiN). Furthermore, the cermet may contain Ni or Co. The coating film 20 will be described later.

Coating Film 20

The coating film 20 is coated on the base body 10 for the purpose of, for example, improving wear resistance, heat resistance, etc. of the base body 10. In the example in FIG. 2, the coating film 20 entirely covers the base body 10. The coating film 20 may be located at least on the base body 10. When the coating film 20 is located on the first surface (here, the upper surface) of the base body 10, the first surface has high wear resistance and heat resistance. When the coating film 20 is located on the second surface (here, the side surface) of the base body 10, the second surface has high wear resistance and heat resistance.

Figure 3:
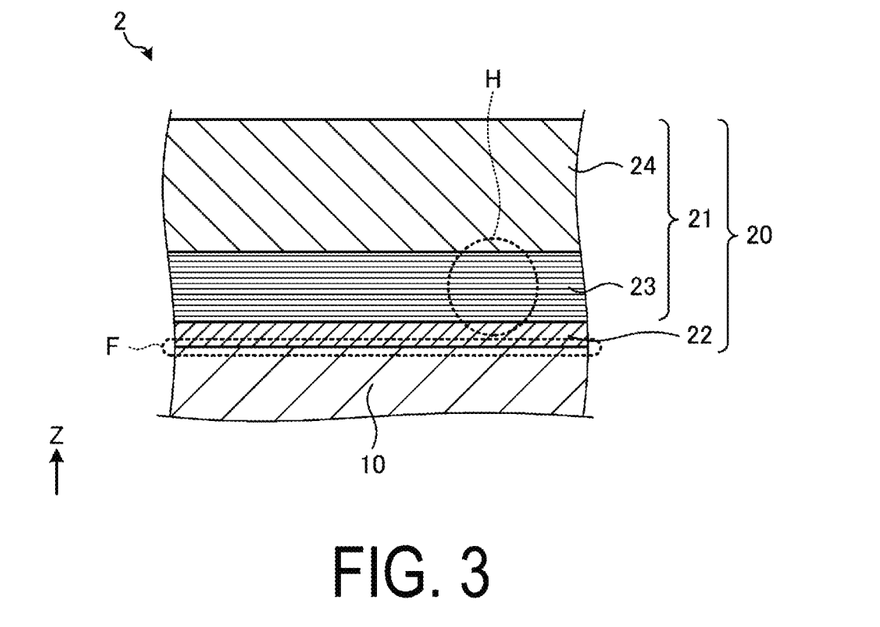
FIG. 3 is a cross-sectional view illustrating an example of the coating film according to the embodiment.

Here, a specific configuration of the coating film 20 will be described with reference to FIG. 3. FIG. 3 is a cross-sectional view illustrating an example of the coating film 20 according to the embodiment.

As illustrated in FIG. 3, the coating film 20 has a hard layer 21. The hard layer 21 is a layer having excellent wear resistance compared with a metal layer 22 described below. The hard layer 21 has one or more metal nitride layers. The hard layer 21 may be one layer. Additionally, as illustrated in FIG. 3, a plurality of metal nitride layers may be overlapped. Additionally, the hard layer 21 may include a laminate portion 23 in which a plurality of metal nitride layers are layered, and a third metal nitride layer 24 located above the laminate portion 23. The configuration of the hard layer 21 will be described later.

Metal Layer 22

Further, the coating film 20 includes the metal layer 22. The metal layer 22 is located between the base body 10 and the hard layer 21. Specifically, the metal layer 22 has one surface (here, a lower surface) in contact with the upper surface of the base body 10 and another surface (here, an upper surface) in contact with the lower surface of the hard layer 21.

The metal layer 22 has a higher adhesion to the base body 10 than to the hard layer 21. Examples of a metal element having such characteristics include Zr, Hf, V, Nb, Ta, Cr, Mo, W, Al, Si, Y, and Ti. The metal layer 22 contains at least one metal element among the above-described metal elements.

Note that a simple substance of Ti, a simple substance of Zr, a simple substance of V, a simple substance of Cr, and a simple substance of Al are not used as the metal layer 22. These are not suitable for use in cutting tools because all of these materials have a low melting point and low oxidation resistance. In addition, a simple substance of Hf, a simple substance of Nb, a simple substance of Ta, and a simple substance of Mo have low adhesion to the base body 10. However, this does not apply to alloys containing Ti, Zr, V, Cr, Ta, Nb, Hf, and Al.

The metal layer 22 may be an Al—Cr alloy layer containing an Al—Cr alloy. Since the metal layer 22 has particularly high adhesion to the base body 10, the effect of improving the adhesion between the base body 10 and the coating film 20 is high.

When the metal layer 22 is an Al—Cr alloy layer, the Al content in the metal layer 22 may be greater than the content of Cr in the metal layer 22. For example, the composition ratio (atomic %) of Al and Cr in the metal layer 22 may be 70:30. With such a composition ratio, the adhesion between the base body 10 and the metal layer 22 is higher.

The metal layer 22 may contain components other than the above metal elements (Zr, Hf, V, Nb, Ta, Cr, Mo, W, Al, Si, Y, and Ti). However, from the perspective of adhesion to the base body 10, the metal layer 22 may contain at least 95 atomic % or more of the metal elements in a combined amount. More preferably, the metal layer 22 may contain 98 atomic % or more of the metal elements in a combined amount. For example, in a case where the metal layer 22 is an Al—Cr alloy layer, the metal layer 22 may contain at least 95% or more of Al and Cr in a combined amount. Furthermore, the metal layer 22 may contain at least 98% or more of Al and Cr in a combined amount. Note that the proportion of the metal components in the metal layer 22 can be identified by, for example, analysis using an energy dispersive X-ray spectrometer (EDS).

The base body 10 may have a binder phase such as Co. The binder phase composed of a metal has a high affinity with the metal layer 22. Thus, by providing the binder phase on the base body 10, adhesion between the base body 10 and the metal layer 22 can be further improved.

As described above, in the coated tool 1 according to the embodiment, by providing the metal layer 22 having higher wettability with the base body 10 than the hard layer 21 between the base body 10 and the hard layer 21, it is possible to improve the adhesion between the base body 10 and the coating film 20. Since the metal layer 22 has high adhesion to the hard layer 21, the hard layer 21 is less likely to peel off from the metal layer 22.

The coated tool 1 may have a compound containing a metal element contained in the base body 10 and a metal element contained in the metal layer 22 at the interface F between the base body 10 and the metal layer 22.

For example, the base body 10 may be a cemented carbide, and the metal layer 22 may be a TiSi layer containing Ti and Si. In this case, the coated tool 1 may have titanium tungsten (TiW) at the interface F between the base body 10 and the metal layer 22.

Since the compound containing a metal element contained in the base body 10 and a metal element contained in the metal layer 22 is present at the interface F between the base body 10 and the metal layer 22 as described above, the adhesion between the base body 10 and the metal layer 22 can be improved. Therefore, according to the coated tool 1, the adhesion between the coating film 20 and the base body (here, the base body 10) can be improved.

The metal layer 22 is formed using an arc ion plating method (AIP method). The AIP method is a method in which target metals are evaporated by using an arc discharge in a vacuum atmosphere, and are combined with $N_2$ gas to form metal nitrides. At this time, the bias voltage applied to the base body 10, which is a coated object, may be 400 V or more. The hard layer 21 described below may also be formed by the AIP method.

Hard Layer 21

Figure 4:
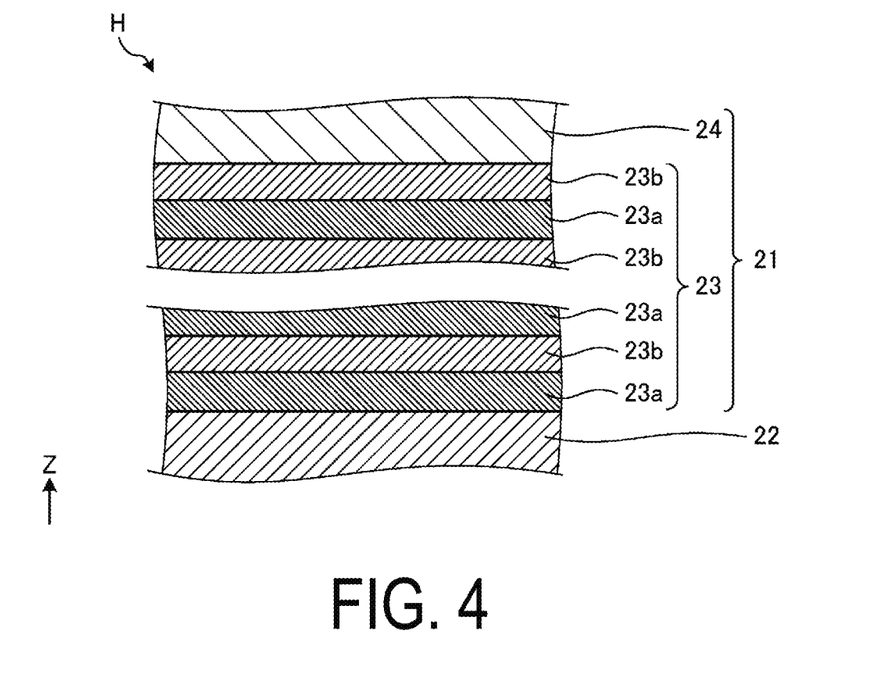
FIG. 4 is a schematic enlarged view of a portion H illustrated in FIG. 3.

Next, the configuration of the hard layer 21 will be described with reference to FIG. 4. FIG. 4 is a schematic enlarged view of a portion H illustrated in FIG. 3.

As illustrated in FIG. 4, the hard layer 21 has the laminate portion 23 located on the metal layer 22 and the third metal nitride layer 24 located on the laminate portion 23.

The laminate portion 23 includes a plurality of first metal nitride layers 23a and a plurality of second metal nitride layers 23b. The laminate portion 23 has a configuration in which the first metal nitride layers 23a and the second metal nitride layers 23b are alternately layered.

The thickness of the first metal nitride layer 23a and the second metal nitride layer 23b may be 50 nm or less, respectively. In this way, by forming the first metal nitride layer 23a and the second metal nitride layer 23b thin, the residual stress of the first metal nitride layer 23a and the second metal nitride layer 23b is small. As a result, for example, peeling and cracking of the first metal nitride layer 23a and the second metal nitride layer 23b are less likely to occur, so that the durability of the coating film 20 is high.

The first metal nitride layer 23a is a layer that contacts the metal layer 22, and the second metal nitride layer 23b is formed on the first metal nitride layer 23a.

The first metal nitride layer 23a and the second metal nitride layer 23b may contain a metal contained in the metal layer 22.

For example, it is assumed that two kinds of metals (here, "first metal" and "second metal") are included in the metal layer 22. In this case, the first metal nitride layer 23a contains a nitride of the first metal and the third metal. The third metal is a metal not included in the metal layer 22. The second metal nitride layer 23b contains a nitride of the first metal and the second metal.

For example, in the embodiment, the metal layer 22 may contain Al and Cr. In this case, the first metal nitride layer 23a may contain Al. Specifically, the first metal nitride layer 23a may be an AlTiN layer containing AlTiN, which is a nitride of Al and Ti. The second metal nitride layer 23b may be an AlCrN layer containing AlCrN, which is a nitride of Al and Cr.

In this way, the first metal nitride layer 23a containing the metal contained in the metal layer 22 is located on the metal layer 22, and thus the adhesion between the metal layer 22 and the hard layer 21 is high. This makes it difficult for the hard layer 21 to peel off from the metal layer 22, so the durability of the coating film 20 is high.

The first metal nitride layer 23a, that is, the AlTiN layer is excellent in terms of, for example, wear resistance in addition to adhesion to the metal layer 22 described above. The second metal nitride layer 23b, that is, the AlCrN layer, has excellent heat resistance and oxidation resistance, for example. In this manner, the coating film 20 includes the first metal nitride layer 23a and the second metal nitride layer 23b having different compositions from each other, and thus properties such as wear resistance and heat resistance of the hard layer 21 can be controlled. Accordingly, the tool life of the coated tool 1 can be extended. For example, in the hard layer 21 according to the embodiment, mechanical properties such as adhesion with the metal layer 22 and wear resistance can be improved while maintaining excellent heat resistance of AlCrN.

The third metal nitride layer 24 may be located on the laminate portion 23. Specifically, the third metal nitride layer 24 is in contact with the second metal nitride layer 23b of the laminate portion 23. The third metal nitride layer 24 is, for example, a metal nitride layer (AlTiN layer) containing Ti and Al similar to the first metal nitride layer 23a.

The thickness of the third metal nitride layer 24 may be greater than each thickness of the first metal nitride layer 23a and the second metal nitride layer 23b. Specifically, as described above, when the thickness of the first metal nitride layer 23a and the second metal nitride layer 23b is 50 nm or less, the thickness of the third metal nitride layer 24 may be 1 μm or more. For example, the thickness of the third metal nitride layer 24 may be 1.2 μm.

As a result, for example, when the coefficient of friction of the third metal nitride layer 24 is low, the welding resistance of the coated tool 1 can be improved. In addition, for example, when the hardness of the third metal nitride layer 24 is high, the wear resistance of the coated tool 1 can be improved. In addition, for example, when the oxidation start temperature of the third metal nitride layer 24 is high, the oxidation resistance of the coated tool 1 can be improved.

The thickness of the third metal nitride layer 24 may be greater than the thickness of the laminate portion 23. Specifically, in the embodiment, when the thickness of the laminate portion 23 is 0.5 μm or less, the thickness of the third metal nitride layer 24 may be 1 μm or more. For example, when the thickness of the laminate portion 23 is 0.3 μm, the thickness of the third metal nitride layer 24 may be 1.2 μm. In this way, the third metal nitride layer 24 is thicker than the laminate portion 23, and thus the effect of improving the welding resistance, wear resistance, etc. described above is further enhanced.

The thickness of the metal layer 22 may be, for example, 0.1 μm or more and less than 0.6 μm. That is, the metal layer 22 may be thicker than each of the first metal nitride layer 23a and the second metal nitride layer 23b, and may be thinner than the laminate portion 23.

When the metal layer 22 is a TiSi layer, the first metal nitride layer 23a may be a nitride layer (AlCrSiN layer) containing Al, Cr, and Si, and the second metal nitride layer 23b may be a nitride layer (TiSiN layer) containing Ti and Si.

When the first metal nitride layer 23a is an AlCrSiN layer, the composition ratio of Cr in the first metal nitride layer 23a is preferably greater than the composition ratio of Al in the first metal nitride layer 23a. That is, the first metal nitride layer 23a is preferably Cr rich. For example, the composition ratio (atomic %) of Al and Cr in the AlCrSiN layer is preferably 40:50. With this composition ratio, it is possible to improve the peeling resistance of the coating film 20 compared with the Al-rich case.

Cutting Tool

Figure 5:
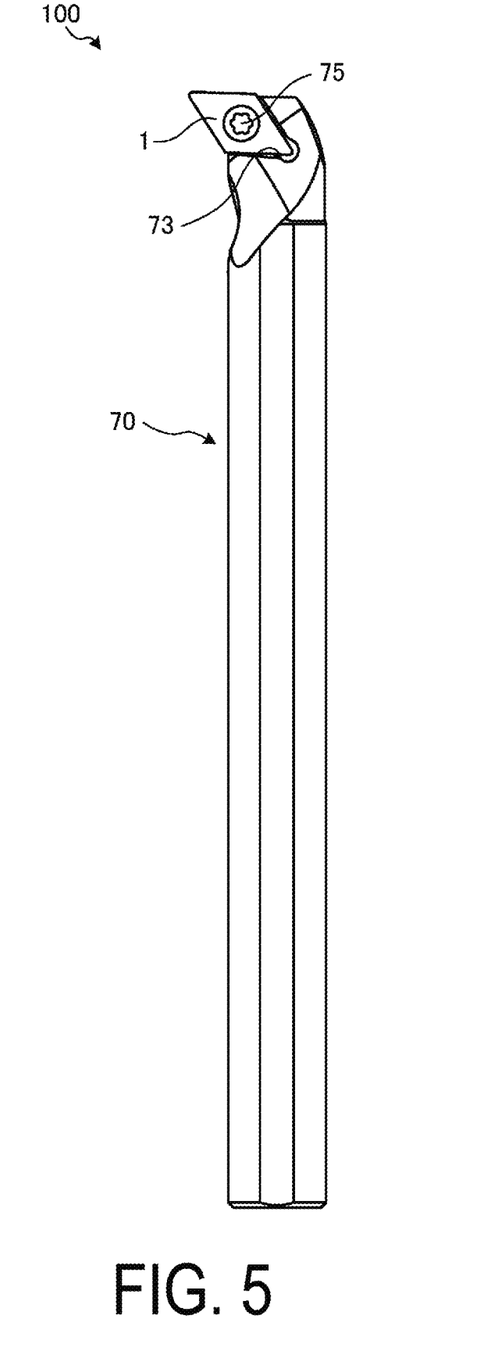
FIG. 5 is a front view illustrating an example of a cutting tool according to the embodiment.

Next, a configuration of a cutting tool including the above-described coated tool 1 will be described with reference to FIG. 5. FIG. 5 is a front view illustrating an example of a cutting tool according to the embodiment.

As illustrated in FIG. 5, the cutting tool 100 according to the embodiment includes the coated tool 1 and a holder 70 for fixing the coated tool 1.

The holder 70 is a rod-shaped member that extends from a first end (an upper end in FIG. 5) toward a second end (a lower end in FIG. 5). The holder 70 is made of, for example, steel or cast iron. In particular, it is preferable to use steel having high toughness among these members.

The holder 70 has a pocket 73 at an end portion on the first end side. The pocket 73 is a portion in which the coated tool 1 is mounted, and has a seating surface intersecting with the rotation direction of the work material and a binding side surface inclined with respect to the seating surface. A screw hole into which a screw 75 described later is screwed is provided on the seating surface.

The coated tool 1 is located in the pocket 73 of the holder 70, and is mounted on the holder 70 by the screw 75. That is, the screw 75 is inserted into the through hole 5 of the coated tool 1, and the tip end of the screw 75 is inserted into the screw hole formed in the seating surface of the pocket 73, and the screw portions are screwed together. Thus, the coated tool 1 is mounted on the holder 70 such that the cutting edge portion protrudes outward from the holder 70.

In the embodiment, a cutting tool used for so-called turning processing is exemplified. As the turning processing, for example, boring, external turning, and groove-forming are cited. Note that, a cutting tool is not limited to those used in the turning processing. For example, the coated tool 1 may be used as a cutting tool used for milling processing.

For example, the cutting processing of the work material includes the steps of (1) rotating a work material, (2) bringing the cutting edge of the coated tool 1 into contact with the rotating work material to cut the work material, and (3) separating the coated tool 1 from the work material. Here, representative examples of the material of the work material include carbon steel, alloy steel, stainless steel, cast iron, non-ferrous metals, etc.

Example 1: Indentation Hardness Test

The inventors of the present application performed an indentation hardness test on each of a sample in which a coating film was formed on a cemented carbide and a sample in which a coating film was formed on a cermet.

The samples are of the following four types.
(1a) A coating film with a metal layer formed on a cemented carbide (hereinafter referred to as "cemented carbide with metal layer")
(1b) A coating film without a metal layer formed on a cemented carbide (hereinafter referred to as "cemented carbide without metal layer")
(2a) A coating film with a metal layer formed on a cermet (hereinafter referred to as "cermet with metal layer")
(2b) A coating film without a metal layer formed on a cermet (hereinafter referred to as "cermet without metal layer")

Figure 6:
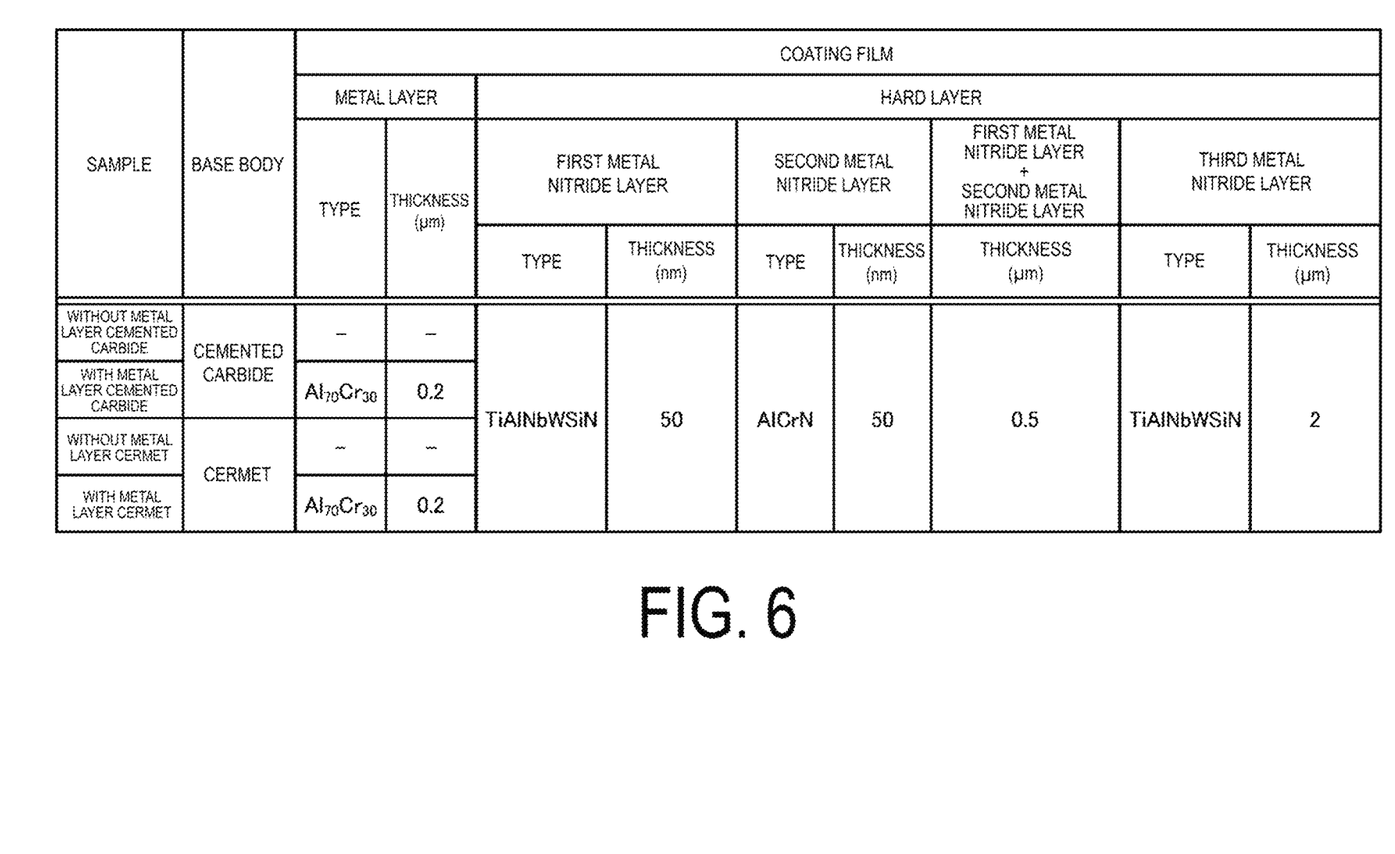
FIG. 6 is a table showing a configuration of each sample.

Here, a specific configuration of each sample will be described with reference to FIG. 6. FIG. 6 is a table showing a configuration of each sample.

As shown in FIG. 6, the cemented carbide with a metal layer has a coating film made of a metal layer and a hard layer on a base body made of a cemented carbide. Specifically, the metal layer is located on the base body, and the hard layer is located on the metal layer. On the other hand, the cemented carbide without a metal layer has a coating film made of a hard layer on a base body made of cemented carbide. Similarly, the cermet with a metal layer has a coating film made of a metal layer and a hard layer on a base body made of a cermet, and the cermet without a metal layer has a coating film made of a hard layer on a base body made of a cermet.

The metal layer in the cemented carbide with a metal layer and the cermet with a metal layer contains Al and Cr. The specific composition of such a metal layer is $Al_{70}Cr_{30}$. That is, the metal layer contains 70 atomic % of Al and 30 atomic % of Cr. The thickness of the metal layer is 0.2 μm.

The hard layer of each sample has a first metal nitride layer, a second metal nitride layer, and a third metal nitride layer. The first metal nitride layer and the second metal nitride layer are alternately layered. In addition, the third metal nitride layer is located on the first metal nitride layer and the second metal nitride layer which are alternately layered.

The ratio of only the metal components of the first metal nitride layer described as TiAlNbWSiN in FIG. 6 is 42 atomic % of Ti, 48 atomic % of Al, 3 atomic % of Nb, 4 atomic % of W, and 3 atomic % of Si. The first metal nitride layer contains about 100 atomic % of N with respect to 100 atomic % of the metal component. The thickness of one first metal nitride layer is 50 nm.

The ratio of only the metal components of the second metal nitride layer described as AlCrN in FIG. 6 is 70 atomic % of Al and 30 atomic % of Cr. The second metal nitride layer contains about 100 atomic % of N with respect to 100 atomic % of the metal component. The thickness of one second metal nitride layer is 50 nm.

The total thickness of the plurality of first metal nitride layers and the plurality of second metal nitride layers is 0.5 μm.

The composition of the third metal nitride layer is the same as the composition of the first metal nitride layer. The thickness of the third metal nitride layer is 2 μm.

Figure 7:
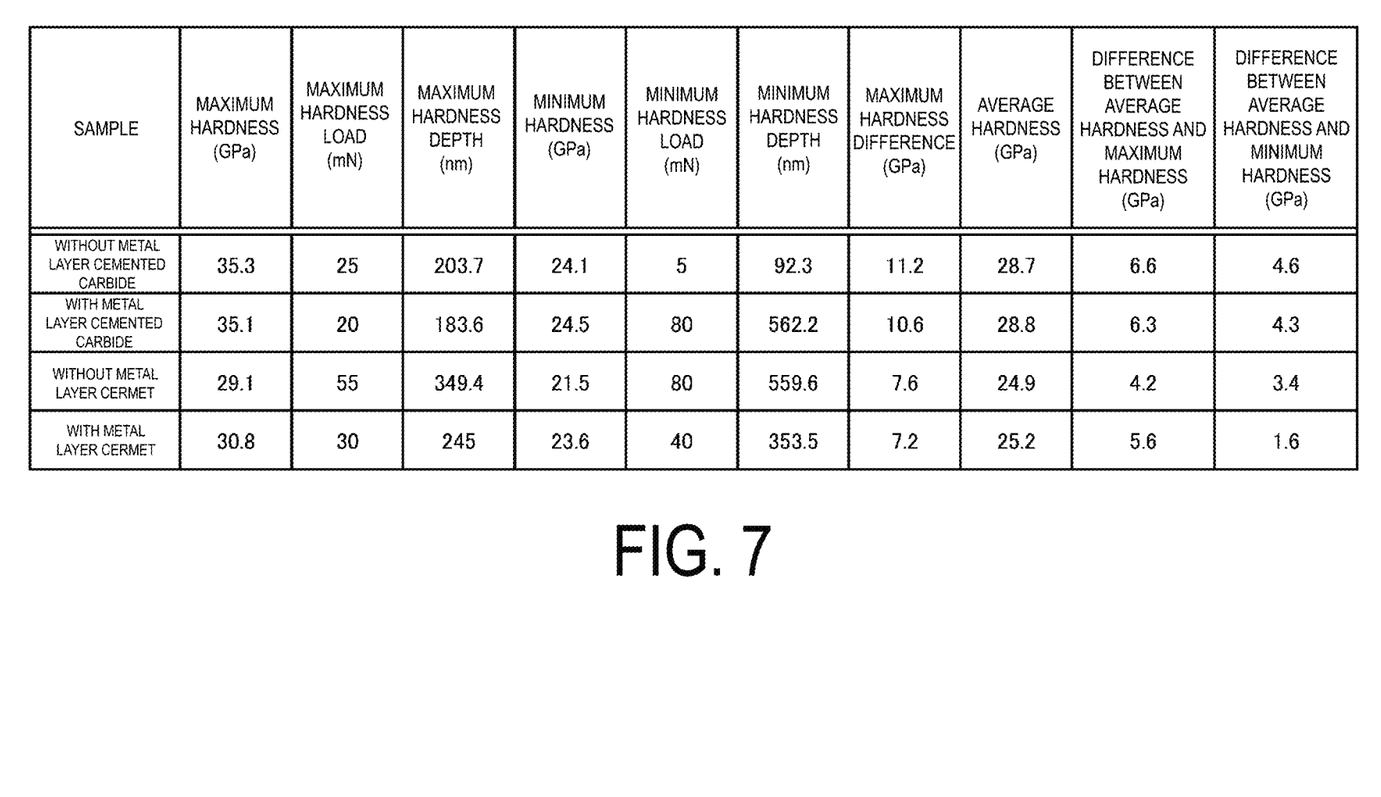
FIG. 7 is a table showing results of an indentation hardness test on each sample.
Figure 8:
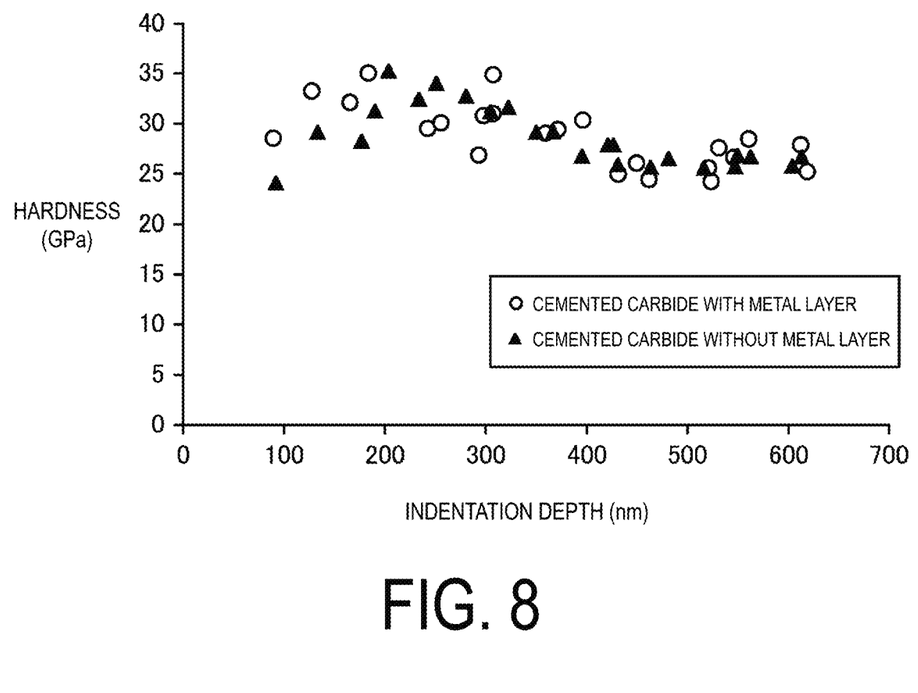
FIG. 8 is a graph showing results of an indentation hardness test on cemented carbide with a metal layer and cemented carbide without a metal layer.
Figure 9:
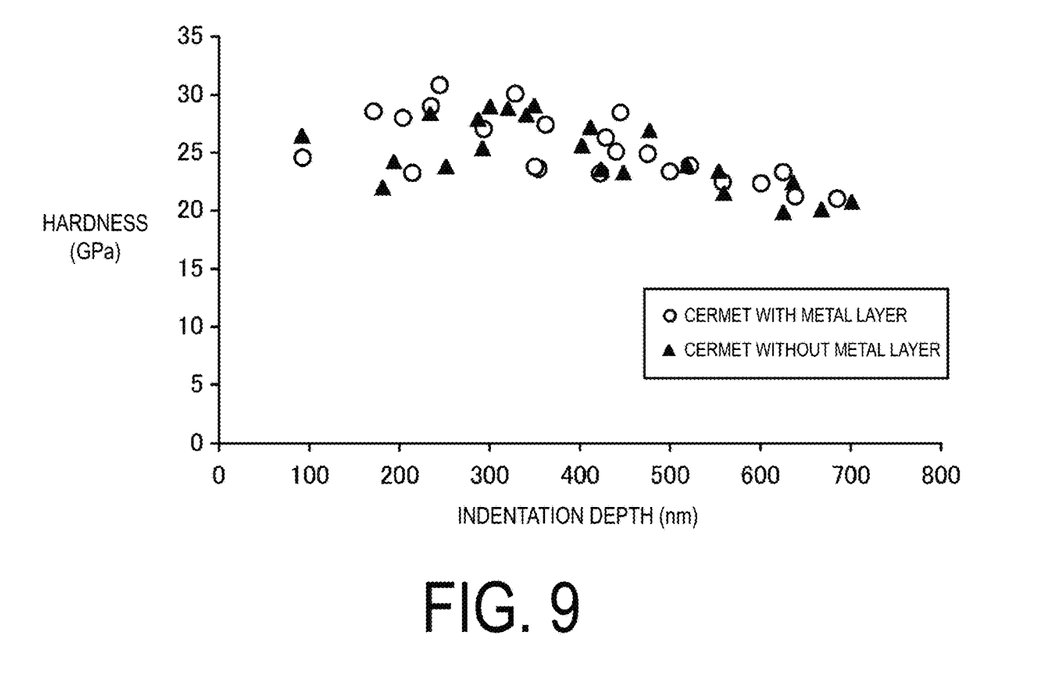
FIG. 9 is a graph showing results of an indentation hardness test on a cermet with a metal layer and a cermet without a metal layer.

The results of the indentation hardness test on such a sample are shown in FIGS. 7 to 9. FIG. 7 is a table showing results of an indentation hardness test on each sample. FIG. 8 is a graph showing results of an indentation hardness test on a cemented carbide with a metal layer and a cemented carbide without a metal layer, and FIG. 9 is a graph showing results of an indentation hardness test on a cermet with a metal layer and a cermet without a metal layer.

The present test was performed using a microindentation hardness tester "ENT-1100b/a" (manufactured by Elionix Inc.).

Prior to measurement of hardness, the thickness of the coating film was measured in the cross section of the base body orthogonal to the surface of the base body. The coating film had a thickness of 2.7 μm when the metal layer was included. The coating film had a thickness of 2.5 μm when the metal layer was not included. The indenter was pushed in from the surface of the coating film by 20% of the thickness of the coating film. The indentation of the indenter into the surface of the coating film was increased approximately every 0.02 μm. This indentation depth can be made deep by increasing the indentation load. Increasing the indentation depth every 0.02 μm is equivalent to increasing the indentation load about every 5 mN.

In this test, when the indenter is pushed in to a depth of 20% of the thickness of the coating film, the hardness from the surface of the coating film to the vicinity of the surface of the base body can be measured. In the present disclosure, as described above, the hardness of the coating film refers to the hardness obtained by pressing an indenter from the surface of the coating film to a depth of 20% of the coating film while changing the indentation load of the indenter. In the indentation hardness test, with deeper indentation depth, it is possible to measure the hardness of a deeper region from the surface of the coating film.

In FIG. 8, the measurement results of the cemented carbide with a metal layer are indicated by white circles, and the measurement results of the cemented carbide without a metal layer are indicated by black triangles. Further, in FIG. 9, the measurement results of the cermet with a metal layer are indicated by white circles, and the measurement results of the cermet without a metal layer are indicated by black triangles.

As shown in FIG. 8, it can be seen that the cemented carbide with a metal layer has a higher hardness on the whole than the cemented carbide without a metal layer. This increase in hardness is marked in a region of the indentation depth from 100 nm to 200 nm. The hardness in the indentation depth from 100 nm to 200 nm indicates the hardness of the hard layer. From this, it can be seen that the cemented carbide with a metal layer has a higher hardness in the hard layer than the cemented carbide without a metal layer.

This tendency also applies to the cermet with a metal layer. That is, as shown in FIG. 9, it can be seen that the cermet with a metal layer has a higher hardness in the hard layer than the cermet without a metal layer.

Figure 10:
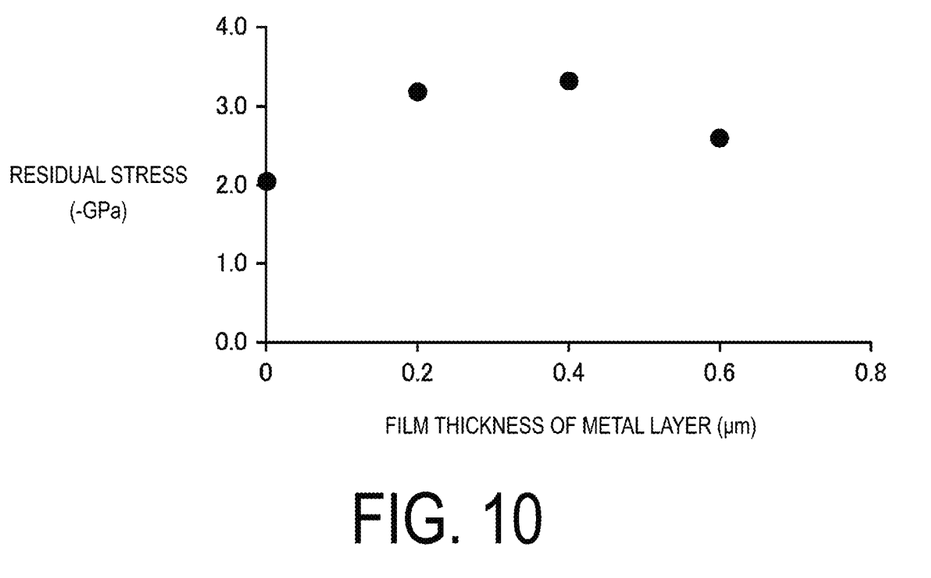
FIG. 10 is a graph showing changes in the residual stress of a coating film when a film thickness of a metal layer is changed.

This point will be described with reference to FIG. 10. FIG. 10 is a graph showing changes in the residual stress of a coating film when the film thickness of a metal layer is changed.

FIG. 10 shows the result of measuring the residual stress of the coating film based on the amount of warpage of the stainless steel plate on which the coating film with a metal layer is formed. In FIG. 10, the results for a film thickness of 0 μm show the residual stress of a coating film having no metal layer, that is, a coating film having only the hard layer. Furthermore, the results for the film thicknesses of 0.2 μm, 0.4 μm, and 0.6 μm show the residual stress of a coating film with a metal layer.

As shown in FIG. 10, it can be seen that the coating film with a metal layer has higher residual stress than the coating film without a metal layer. The higher the residual stress, the higher the hardness of the coating film. Therefore, it can be seen that the hardness of the coating film increases by forming the metal layer.

One reason why the residual stress of the coating film increases due to the metal layer is considered to be as follows. That is, in PVD coating, a bias voltage is applied to an object (such as the cemented carbide) on which a film is to be formed, and by forming a metal layer, more ions are attracted to the object on which the film is to be formed when the bias voltage is applied. As a result, it is thought that a higher residual stress occurred in the coating film with a metal layer than in the coating film without a metal layer.

Note that when the film thickness of the metal layer was 0.6 μm, peeling of the coating film occurred and the residual stress was reduced. From this result, the film thickness of the metal layer is preferably from 0.1 μm to less than 0.6 μm.

In addition, as shown in FIGS. 8 and 9, the cemented carbide with a metal layer and the cermet with a metal layer have a hardness valley in the vicinity of an indentation depth of 300 to 350 nm. This is a feature that is not found in the cemented carbide without a metal layer and the cermet without a metal layer. The hardness in the vicinity of the indentation depth of 300 to 350 nm indicates the hardness of the metal layer. It is thought that such a hardness valley was formed because the metal layer is softer than the hard layer.

Among the results shown in FIG. 7, the "maximum hardness" is the maximum value of the hardness in the measurement range (range from the surface of the coating film to 20% of the depth of the coating layer), and the "minimum hardness" is the minimum value of the hardness in the measurement range. The "maximum hardness load" is the indentation load of the indenter at the maximum hardness, and the "maximum hardness depth" is the indentation depth of the indenter at the maximum hardness. The "minimum hardness load" is the indentation load of the indenter at the minimum hardness, and the "minimum hardness depth" is the indentation depth of the indenter at the minimum hardness.

The "maximum hardness difference" is the difference between the maximum hardness and the minimum hardness. The "average hardness" is an average value of hardness in a measurement range.

Here, for each of the cemented carbide with a metal layer and the cermet with a metal layer, the minimum hardness is referred to as a "first hardness", and the maximum hardness is referred to as a "second hardness". The indentation depth at the first hardness is referred to as a "first hardness depth", and the indentation depth at the second hardness is referred to as a "second hardness depth".

As shown in FIGS. 8 and 9, in the cemented carbide with a metal layer and the cermet with a metal layer, the second hardness depth is smaller than the first hardness depth. That is, it can be seen that both the cemented carbide with a metal layer and the cermet with a metal layer have the maximum hardness on the surface layer side of the coating film. In both of the cemented carbide with a metal layer and the cermet with a metal layer, the difference (maximum hardness difference) between the first hardness and the second hardness is larger than 7 GPa.

Thus, the coating film may have a high-hardness region and a low-hardness region. In addition, the high-hardness region may be located closer to the front side of the coating film than the low-hardness region, and the difference may be larger than 7 GPa. In this case, the high-hardness region has high wear resistance, and the low-hardness region has a high fracture resistance. Therefore, the coated tool having such a coating film has a long life.

In addition, in the cemented carbide with a metal layer and the cermet with a metal layer, the first hardness depth is larger than 100 nm which is the minimum indentation depth.

In this case, a region having a hardness lower than the first hardness is located on the surface side of the coating film. Therefore, the coated tool having such a coating film has a relatively high toughness on the surface side, and is less prone to an initial fracture.

For the cemented carbide with a metal layer and the cermet with a metal layer, the minimum indentation depth (100 nm) is defined as a "third hardness depth", and the hardness at the third hardness depth is defined as a "third hardness". In this case, the cemented carbide with a metal layer has a fourth hardness lower than the third hardness between the third load and the first load.

As described above, a coated tool having a coating film in which regions having a low hardness and regions having a high hardness are alternately located has a long life.

The first hardness depth in the cemented carbide with a metal layer may be from 300 nm to 600 nm.

In this case, a region with a high hardness is located near the surface of the coating film, and a region having superior wear resistance is exposed at a relatively early stage. Therefore, the coated tool having such a coating film has a long life.

Example 2: Scratch Test and Peel Test

In addition, the inventors of the present application performed a scratch test and a peel test on each sample of the above-described cemented carbide without a metal layer, cemented carbide with a metal layer, cermet without a metal layer, and cermet with a metal layer. The scratch test was evaluated by the magnitude of the peel load, and the larger the peel load, the more difficult the peeling. In addition, the longer the peel time, the less likely it is for peeling to occur.

The scratch test was performed using a diamond indenter having a tip shape with a curvature radius R of 200 μm at a rate of 10 mm/min and a load rate of 100 N per minute.

The peel test was performed on a hardened SCM415 work piece using a tool-shaped sample of CNGA120408S01225 under the processing conditions of cutting rate: 150 m/min, feed rate: 0.1 mm/rotation, and depth of cut: 0.2 mm, and the time until the hard layer peeled off was evaluated.

When the cemented carbide without a metal layer and the cemented carbide with a metal layer were compared, the peel load of the cemented carbide with a metal layer was larger and the peel time was significantly longer than those of the cemented carbide without a metal layer. Furthermore, when the cermet without a metal layer and the cermet with a metal layer were compared, the peel load of the cermet with a metal layer was larger and the peel time was significantly longer than those of the cermet without a metal layer. As described above, in the cemented carbide with a metal layer and the cermet with a metal layer, peeling of the coating film is less likely to occur than in the cemented carbide without a metal layer and the cermet without a metal layer, that is, the durability of the coating film is high.

Variation

In the embodiment described above, the shape of the upper surface and the lower surface of the coated tool 1 is a parallelogram, but the shape of the upper surface and the lower surface of the coated tool 1 may be diamond or square. Additionally, the shape of the upper surface and the lower surface of the coated tool 1 may be triangular, pentagonal, hexagonal, etc.

The shape of the coated tool 1 may be of a positive type or negative type. The positive type is a type in which the side surface is inclined with respect to the central axis passing through the center of the upper surface and the center of the lower surface of the coated tool 1, and the negative type is a type in which the side surface is parallel to the central axis.

In the embodiment described above, the coated tool 1 has been described as being used for cutting processing, but the coated tool according to the present application can also be applied to a tool other than a cutting tool, such as a tool or a cutting edge for excavation.

Further effects and variations can be readily derived by those skilled in the art. Thus, a wide variety of aspects of the present invention are not limited to the specific details and representative embodiments represented and described above. Accordingly, various changes are possible without departing from the spirit or scope of the general inventive concepts defined by the appended claims and their equivalents.

| Reference Signs List |
|---|
| 1 Coated tool |
| 2 Tip body |
| 5 Through hole |
| 10 Base body |
| 20 Coating film |
| 21 Hard layer |
| 22 Metal layer |
| 23 Laminate portion |
| 23a First metal nitride layer |
| 23b Second metal nitride layer |
| 24 Third metal nitride layer |
| 70 Holder |
| 73 Pocket |
| 75 Screw |
| 100 Cutting tool |

The invention claimed is:

1. A coated tool, comprising:
a base body made of a cemented carbide alloy or a cermet; and
a coating film on the base body, wherein
in a case where a hardness is measured by pressing an indenter from a surface of the coating film to a depth of 20% of the coating film while changing an indentation load of the indenter,
when a minimum hardness of the hardness is defined as a first hardness, a maximum hardness of the hardness is defined as a second hardness, a depth at the first hardness is defined as a first hardness depth, and a depth at the second hardness is defined as a second hardness depth,
the second hardness depth is smaller than the first hardness depth, and
a difference between the first hardness and the second hardness is greater than 7 GPa,
the coating film comprises:
a hard layer;
a metal layer between the base body and the hard layer,
the hard layer comprises:
a laminate portion on the metal layer and comprising a plurality of first metal nitride layers and a plurality of second metal nitride layers, the plurality of first metal nitride layers and the plurality of second metal nitride layers being alternately layered; and
a third metal nitride layer on the laminate portion,
the metal layer contains Al and Cr,
each first metal nitride layer among the plurality of first metal nitride layers contains AlTiN,
each second metal nitride layer among the plurality of second metal nitride layers contains AlCrN,
the third metal nitride layer contains AlTiN,
a thickness of the metal layer is less than a thickness of the laminate portion, and
a thickness of the third metal nitride layer is greater than the thickness of the laminate portion.

2. The coated tool according to claim 1, wherein the first hardness depth is greater than 100 nm.

3. The coated tool according to claim 1, wherein in a case where the hardness when the depth is 100 nm is defined as a third hardness, the coated tool has a fourth hardness at a depth between 100 nm and the first hardness depth, the fourth hardness being lower than the third hardness.

4. The coated tool according to claim 1, wherein the base body is a cemented carbide alloy, and the first hardness depth is from 300 nm to 600 nm.

5. The coated tool according to claim 1, wherein the metal layer contains Al and Cr in a combined amount of 95 atomic % or more.

6. The coated tool according to claim 1, wherein the base body comprises a binder phase.

7. The coated tool according to claim 1, wherein a thickness of each of the plurality of first metal nitride layers is 50 nm or less, and a thickness of each of the plurality of second metal nitride layers is 50 nm or less.

8. A cutting tool, comprising:
a rod-shaped holder comprising a pocket at an end thereof; and
a coated tool in the pocket, the coated tool comprising:
a base body made of a cemented carbide alloy or a cermet; and
a coating film on the base body, wherein
in a case where a hardness is measured by pressing an indenter from a surface of the coating film to a depth of 20% of the coating film while changing an indentation load of the indenter,
when a minimum hardness of the hardness is defined as a first hardness, a maximum hardness of the hardness is defined as a second hardness, a depth at the first hardness is defined as a first hardness depth, and a depth at the second hardness is defined as a second hardness depth,
the second hardness depth is smaller than the first hardness depth, and
a difference between the first hardness and the second hardness is greater than 7 GPa,
the coating film comprises:
a hard layer;
a metal layer between the base body and the hard layer,
the hard layer comprises:
a laminate portion on the metal layer and comprising a plurality of first metal nitride layers and a plurality of second metal nitride layers, the plurality of first metal nitride layers and the plurality of second metal nitride layers being alternately layered; and a third metal nitride layer on the laminate portion, the metal layer contains Al and Cr, each first metal nitride layer among the plurality of first metal nitride layers contains AlTiN, each second metal nitride layer among the plurality of second metal nitride layers contains AlCrN, the third metal nitride layer contains AlTiN, a thickness of the metal layer is less than a thickness of the laminate portion, and a thickness of the third metal nitride layer is greater than the thickness of the laminate portion.

* * * * *